United States Patent
Vajda

(10) Patent No.: US 6,501,269 B1
(45) Date of Patent: Dec. 31, 2002

(54) VECTOR KERR MAGNETOMETRY

(75) Inventor: Ferenc Vajda, Winchester, MA (US)

(73) Assignee: ADE Corporation, Westwood, MA (US)

( * ) Notice: Subject to any disclaimer, the term of this patent is extended or adjusted under 35 U.S.C. 154(b) by 0 days.

(21) Appl. No.: 09/795,880

(22) Filed: Feb. 28, 2001

(51) Int. Cl.$^7$ ............................................. G01R 33/02
(52) U.S. Cl. ..................... 324/244.1; 324/96
(58) Field of Search ........................ 324/244.1, 96, 324/174, 175, 207.13, 207.24, 207.25, 142; 359/258, 280

(56) References Cited

U.S. PATENT DOCUMENTS

| | | | | |
|---|---|---|---|---|
| 5,034,679 A | * | 7/1991 | Henderson et al. ............ 324/96 |
| 5,736,856 A | * | 4/1998 | Oliver et al. .............. 324/244.1 |
| 5,994,898 A | * | 11/1999 | DiMarzio et al. ......... 324/244.1 |

* cited by examiner

*Primary Examiner*—Edward Lefkowitz
*Assistant Examiner*—Subhash A Zaveri
(74) *Attorney, Agent, or Firm*—Weingarten, Schurgin, Gagnebin & Lebovici LLP

(57) ABSTRACT

A system and method for realizing vector Kerr magnetometry are disclosed. The system enables simultaneous longitudinal and transverse Kerr effect measurements at each point on a sample surface. An optional component includes a sample platform for achieving precise linear and rotational relocation. The repositionable platform enables complete, 360 degree characterization about a single point. Additionally, the platform control mechanism may be utilized in obtaining longitudinal and transverse Kerr effect measurements at succeeding points on the surface of a sample. Rapid sample characterization is thus achieved.

19 Claims, 8 Drawing Sheets

VECTOR KERR MAGNETOMETRY

CROSS REFERENCE TO RELATED APPLICATIONS

N/A

STATEMENT REGARDING FEDERALLY SPONSORED RESEARCH OR DEVELOPMENT

N/A

BACKGROUND OF THE INVENTION

This invention pertains to Kerr effect magnetometry in general, and in particular to a system and method for realizing multi-dimensional or vector Kerr effect magnetometry.

The Magneto-optic Kerr effect (MOKE), or more simply referred to as the Kerr effect, corresponds to a change in the intensity or polarization state of light reflected from a magnetic material. Since the amount of change in the polarization state or intensity is proportional to the magnetization in the material, it is possible to use this effect to examine magnetic properties of a material sample.

The prior art has provided three discrete geometries for characterizing a material sample: longitudinal MOKE; transverse MOKE; and polar MOKE. With a longitudinal MOKE geometry, a magnetic field is applied parallel to the plane of the film and the plane of incidence of the light. With a transverse MOKE geometry, the magnetic field is applied perpendicular to the plane of incidence of the light. With a polar MOKE geometry, the magnetic field is applied orthogonal to the surface of the sample. In all cases, a polarization rotation in the detected light provides an indication of the relative magnetization of the sample under test.

Another prior art approach employed for characterizing light transmissive materials is a polar Faraday effect system. A magnetic field is applied parallel to the surface of the material under test. Light is emitted through a point in the material under test and is received on the opposite side of the material. Intensity or polarization changes in the received light are used to characterize the response of the material to the applied field. Practically speaking, the detector can be located in any location as long as the appropriate optics are employed for relaying the received light.

Systems employing the longitudinal, transverse or polar geometries may be referred to as scalar systems. Scalar analysis has to-date provided the only non-contact, non-destructive approach for detecting magnetic response.

Certain magnetic materials are described as being anisotropic, in that the magnetic response to an applied magnetic field at a point on the surface of the material varies in theta about the point, theta being defined in the plane of the material sample. In general, anisotropic materials exhibit a variation on magnetic behavior in one or multiple directions some of which may or may not be in the plane of the sample. Thus, in the presence of a magnetic field applied in the x direction, a material sample may exhibit one characteristic response in light reflected off the sample in a plane parallel to the x direction, while exhibiting a different characteristic response in light reflected off the sample in a plane parallel to the y direction.

In order to measure the degree of anisotropy of a sample using scalar Kerr effect systems of the prior art, it has been necessary to obtain measurements from two separate devices, one longitudinal and one transverse. Proper alignment between instruments becomes difficult, as is the ability to gauge the relative strength of the discrete applied fields.

The easy axis of a material is the axis along which the material is most readily magnetized in the presence of an externally applied magnetic field. Certain materials exhibit easy axis dispersion, where the easy axis varies from point to point across the surface of the sample. Scalar detection systems have consequently provided incomplete characterization of anisotropic materials.

BRIEF SUMMARY OF THE INVENTION

A system and method for realizing vector Kerr magnetometry is disclosed. The system enables simultaneous longitudinal and transverse Kerr effect measurements at a single point on a sample surface. Consequently, anisotropic materials may be more completely, rapidly and accurately characterized. The system may be used with a variety of materials to be tested, including but not limited to magnetic media (e.g. hard drive platters), thin film heads, magnetic random access memory (MRAM) and permanent magnetic wafers.

An optional component of the presently disclosed system includes a sample platform with motive elements and an associated controller for achieving precise relocation of the sample under test in x, y, and theta. Thus, even though the present system enables two-dimensional hysteresis loop characterization at a sample location without sample movement, the repositionable platform as disclosed enables complete, 360 degree characterization about a single point, if desired. Alternatively, the highly precise control mechanisms may be utilized in obtaining longitudinal and transverse Kerr effect measurements at succeeding points on the surface of a sample. Rapid sample characterization is thus achieved, including easy axis dispersion measurement with a much higher accuracy as compared to prior art measurement systems.

A further embodiment of the presently disclosed system includes the integration of a polar Faraday effect emitter/detector pair in conjunction with the vector Kerr magnetometry system disclosed above, either with or without the x, y, and theta translatable sample platform. More accurate and rapid sample characterizations are thereby achieved.

BRIEF DESCRIPTION OF THE SEVERAL VIEWS OF THE DRAWING

These and other features of the present invention are more fully set forth in the detailed description and accompanying drawings of which.

DETAILED DESCRIPTION OF THE INVENTION

Figure 1:
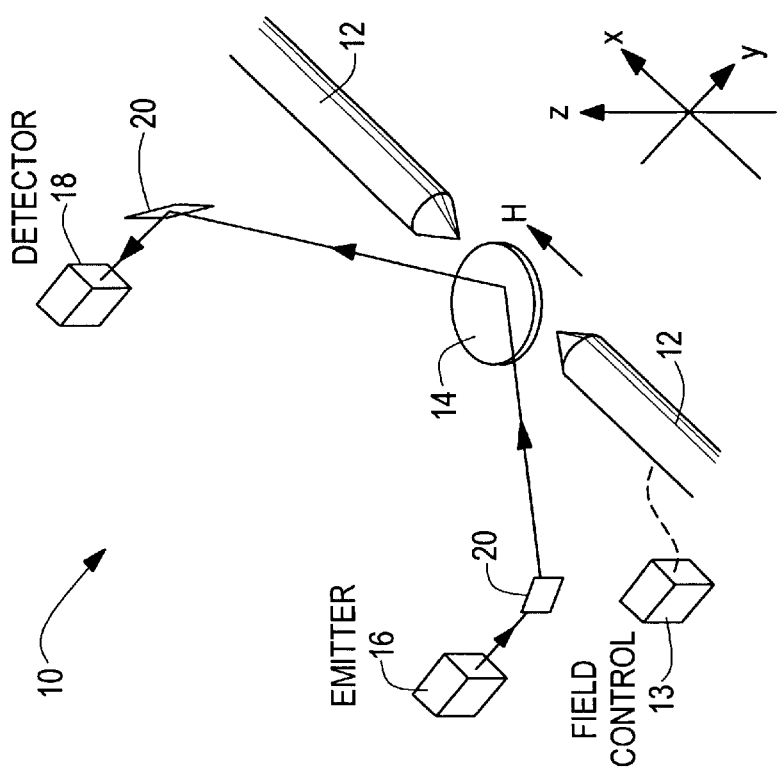
FIG. 1 is a perspective view of a scalar magneto-optic Kerr effect sensor according to the prior art.

A prior art longitudinal magneto-optic Kerr effect sensor system 10 is illustrated in FIG. 1. Magnetic pole pieces 12 are used to apply a magnetic field H across the surface of a sample under test 14. The applied field is under the control of a control unit 13 such as a programmed computer; the relationship between the control unit 13 and the pole pieces is illustrated in FIG. 1 as a dashed line. It should be appreciated that the actual relative dimensions of the pole pieces and the sample under test should not be inferred from this illustration. Rather, the depiction is intended merely to illustrate the relative arrangements of the components of the system.

Also shown in FIG. 1 is a light source or emitter 16 and a detector 18. The source 16 is typically a laser light source, and the detector 18 is capable of detecting the relative polarization of the received light beam. One or more mirrors 20 are also typically employed for causing the light beam to impinge, at a desired angle, upon a point of interest on the surface of the sample 14. The actual physical arrangement of the source 16, detector 18 and mirrors 20 is not of significance as long as the illuminated spot on the sample surface is within a region where the applied magnetic field is substantially parallel with the surface of the sample. When so arranged, the polarization of the impinging light is effected by the magnetization of the sample at the illuminated point, and the relative shift in polarization as detected at the detector is used to identify magnetic characteristics of the sample. A data processor (not shown) in communication with the detector 18 is used to extract characterizing data from detector output data.

As previously mentioned, the prior art has also included a transverse detection system, whereby the light source, the detector, and the optical elements 20 are aligned such that the light beam impinges upon the sample in a plane, defined by the y and z axes, orthogonal to the direction of the applied magnetic field. Such an arrangement is not illustrated.

Both the longitudinal and transverse systems may be described as scalar systems since they only provide a representation of the magnetization in one direction. As anisotropic materials have both hard and easy axes of magnetization, scalar systems provide an incomplete characterization of such materials. The deficiency of the prior art is exacerbated by the tendency for many anisotropic materials to exhibit easy axis dispersion, wherein the easy axis direction changes from point to point on the surface of the material under test.

Figure 2:
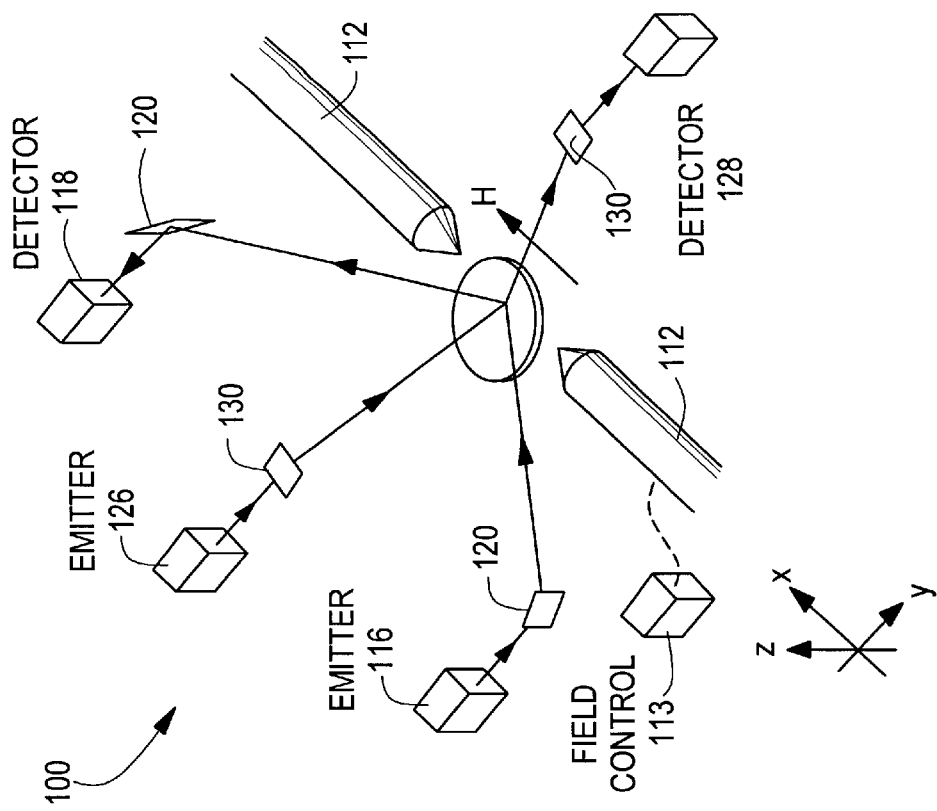
FIG. 2 is a perspective view of a vector magneto-optic Kerr effect sensor according to the present invention.

FIG. 2 illustrates a vector Kerr effect sensor system 100 which is capable of measuring the magnetization characteristics of a sample along multiple axes at the same time. As in FIG. 1, pole pieces 112 are employed to generate a magnetic field H across the surface of the material under test 114. As with the prior art scalar system, a controller 113 is employed to control the operation of the magnetic field system according to predefined parameters. A first emitter 116 and detector 118 pair, with associated optics 120, is employed for characterizing the sample 114 along a first axis (the x axis in the illustration), while a second emitter 126 and detector 128 pair, with associated optics 130, is employed for characterizing the sample along a second axis (the y axis in the illustration). As with respect to FIG. 1, the relative or absolute sizes of the elements depicted are not to be construed from this diagram, and preferred locations for the emitters, detectors and optics are not necessarily as shown. In fact, a variety of considerations including system footprint may dictate the physical arrangement of these elements.

A variety of control arrangements may be provided for coordinating the operation of the emitter/detector pairs. For the sake of simplicity, such arrangements are not illustrated in FIGS. 2, 3, or 4. For instance, a single controller such as a programmed computer may be in communication with both emitters and both detectors for causing the emission of test radiation and for receiving the detected output. Data processing and/or communication to other computing devices may be carried out by the single controller. Alternatively, discrete controllers may be provided for each emitter/detector pair. Once again, the discrete controllers may be networked together, and may be further networked to other processing elements.

Discrete emitter/detector pairs are shown in FIG. 2 for measuring along respective axes. However, in a further embodiment of the presently disclosed invention (not illustrated), a single emitter is utilized for both axes, and in yet another embodiment (not illustrated), a single detector is employed. In the latter embodiment, the detector is capable of differentiating between the reflected signals of the two axes based upon the relative shift between received signals. Alternatively, the reflected signals may be time-division multiplexed, with detection occurring in synchronism with the multiplexing.

The detector(s) are capable of detecting the change in polarization in the received signals. As noted above, a processing element such as a personal computer, directly connected or in communication with the detector(s) via a communications pathway including a local or wide area network, is employed to record the output of the detector, and optionally to provide further processing including graphical analysis and extraction of parameters including shift of the free layer loop, coercivity of the free layer, shift of the pinning layer loop, and coercivity of the pinning layer. Importantly, however, this data collection and analysis pertains to data from two scalars—longitudinal and transverse.

The detector data produced by the presently disclosed system may be used to generate graphs of applied magnetic field, measured in Oersteds (Oe), versus the detected Kerr rotation, measured in thousands of a degree (mDeg). As discussed previously, anisotropic materials exhibit an easy axis along which the material is easily magnetized in the presence of an applied magnetic field and a hard axis along which the material resists magnetization in the presence of an applied magnetic field.

Figure 5:
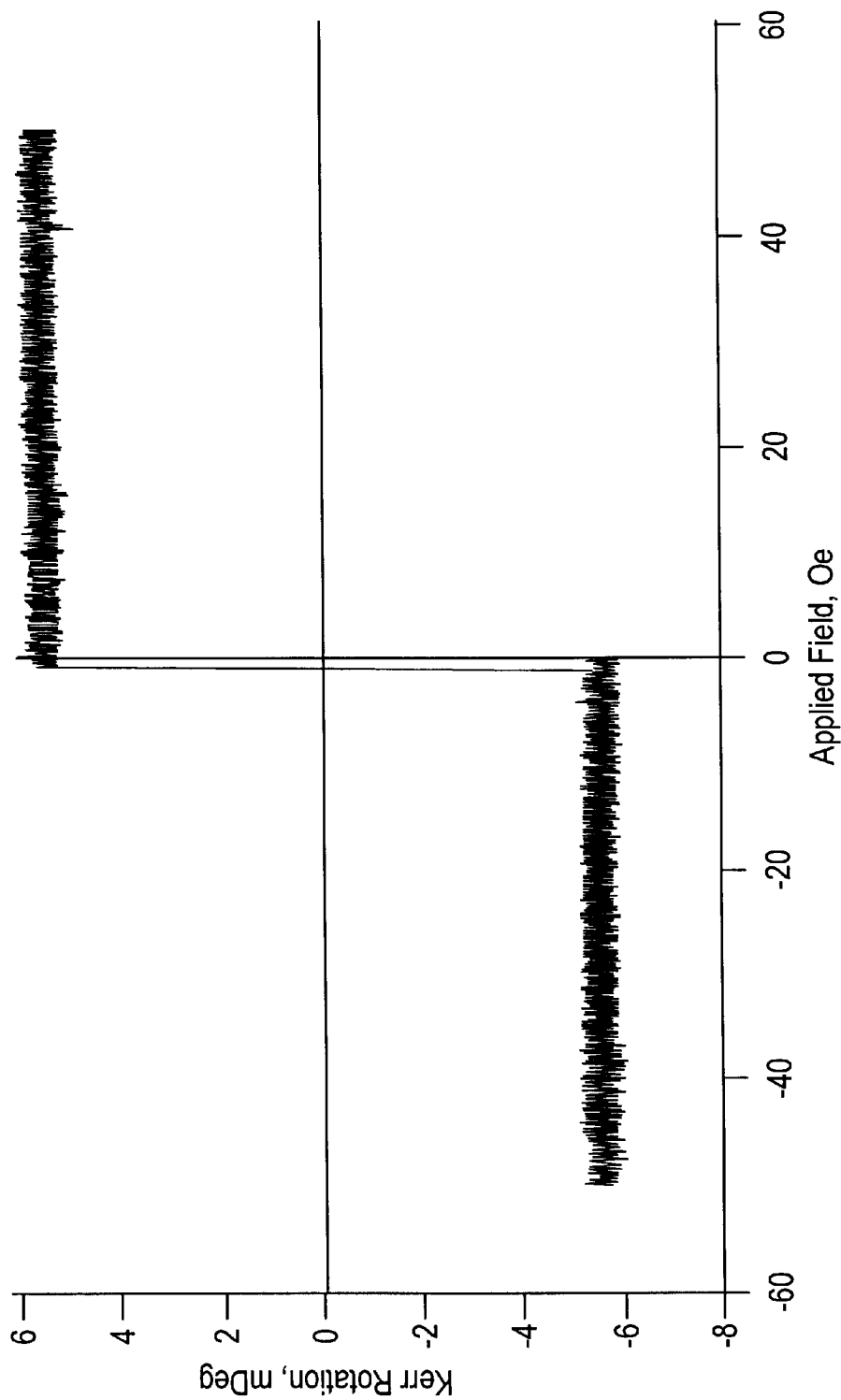
FIG. 5 is a graph of applied magnetic field versus Kerr effect rotation detected along the x axis, wherein the easy axis of the material at the sample point is substantially parallel to the x axis.
Figure 6:
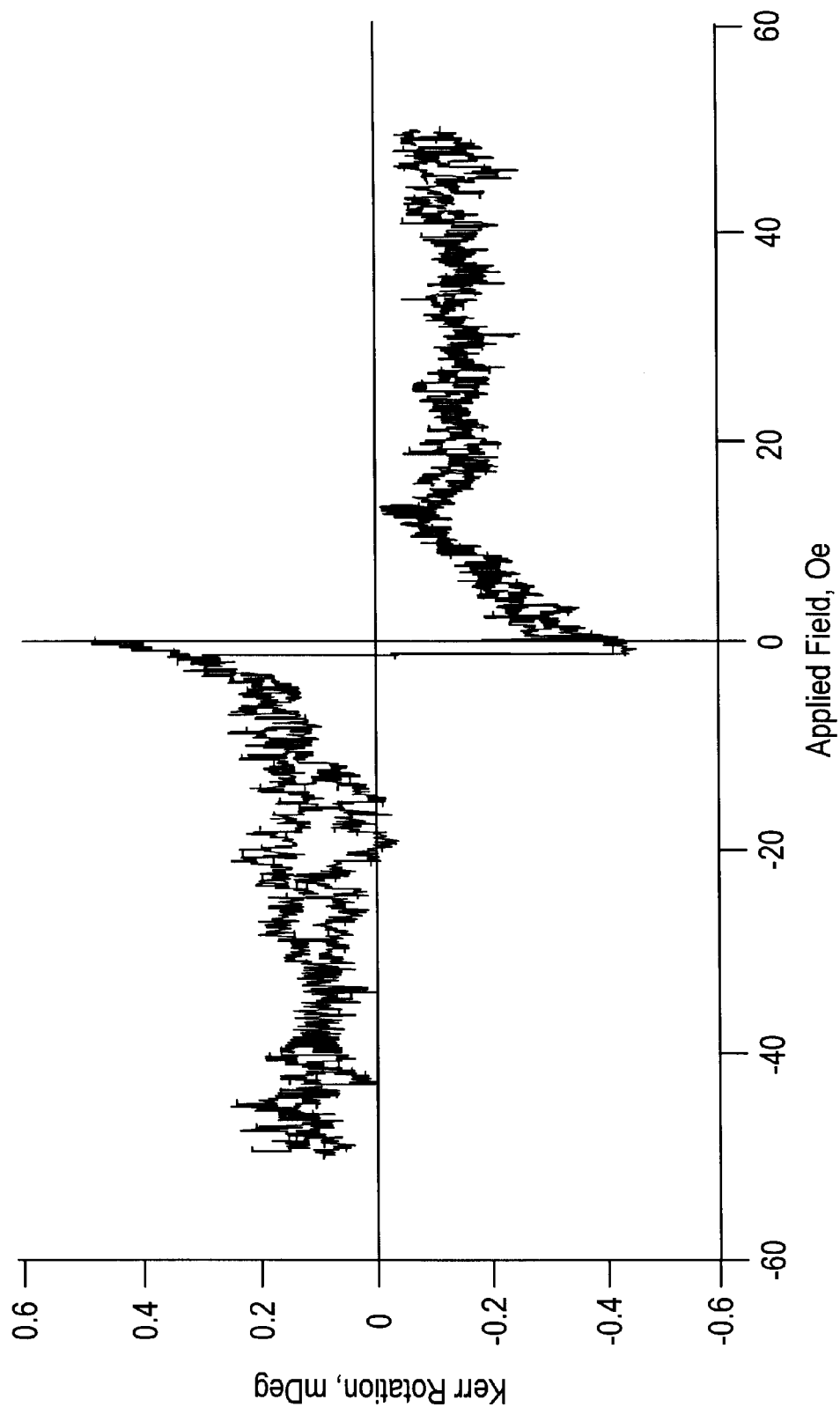
FIG. 6 is a graph of applied magnetic field versus Kerr effect rotation detected along the y axis, wherein the easy axis of the material at the sample point is substantially parallel to the y axis.

FIG. 5 illustrates a hysteresis response loop for a thin film magnetic read head material (e.g. for giant magnetoresistance or GMR heads) measured along the x axis. Here, the easy axis is aligned with the x axis as evidenced by the sharp change in Kerr rotation in a relatively small applied magnetic field. FIG. 6 illustrates measurements made along the transverse or y axis when the easy axis of the sample, at the point of observation, is substantially aligned with the y axis.

Figure 7:
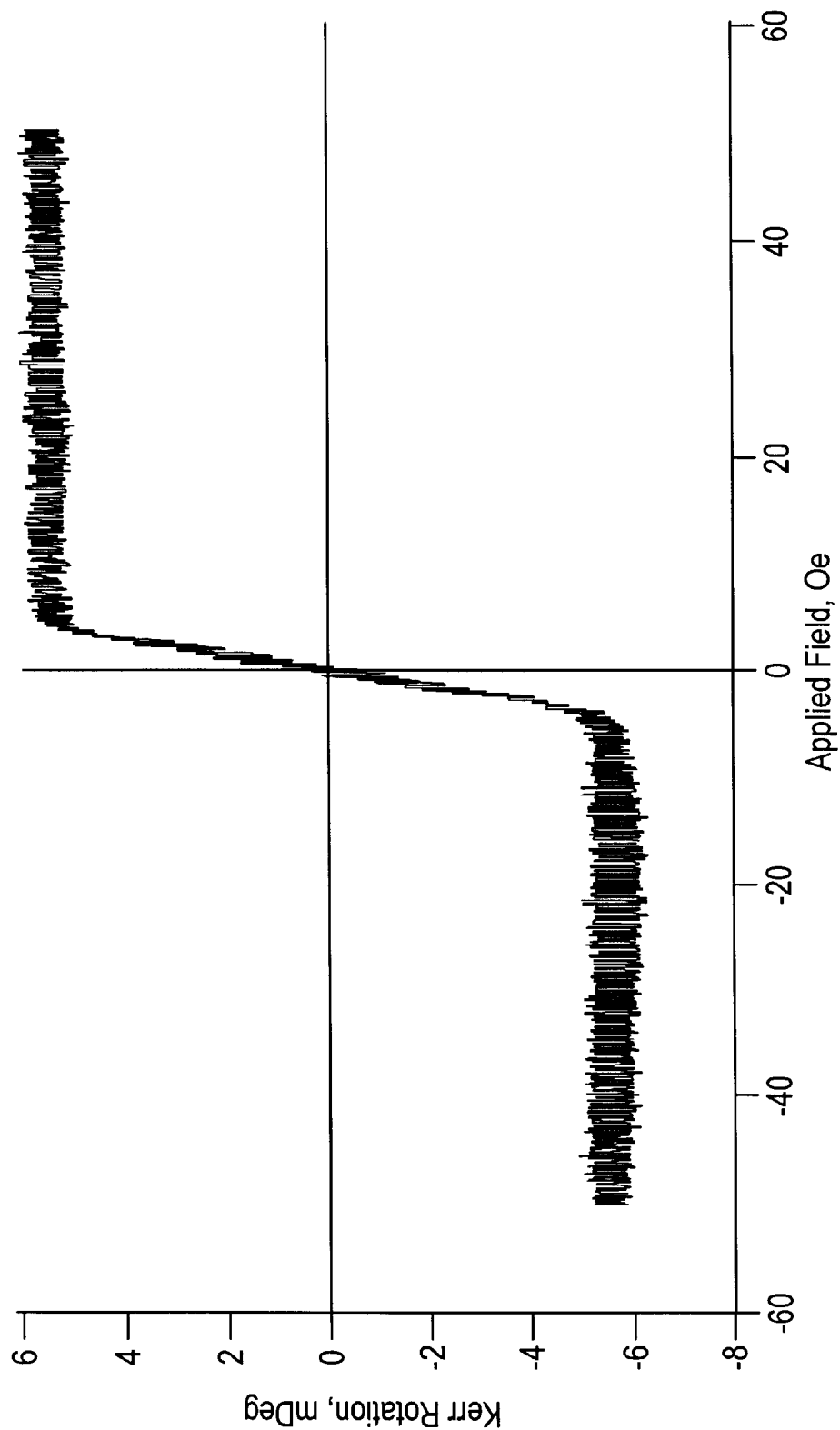
FIG. 7 is a graph of applied magnetic field versus Kerr effect rotation detected along the x axis, wherein the hard axis of the material at the sample point is substantially parallel to the x axis.
Figure 8:
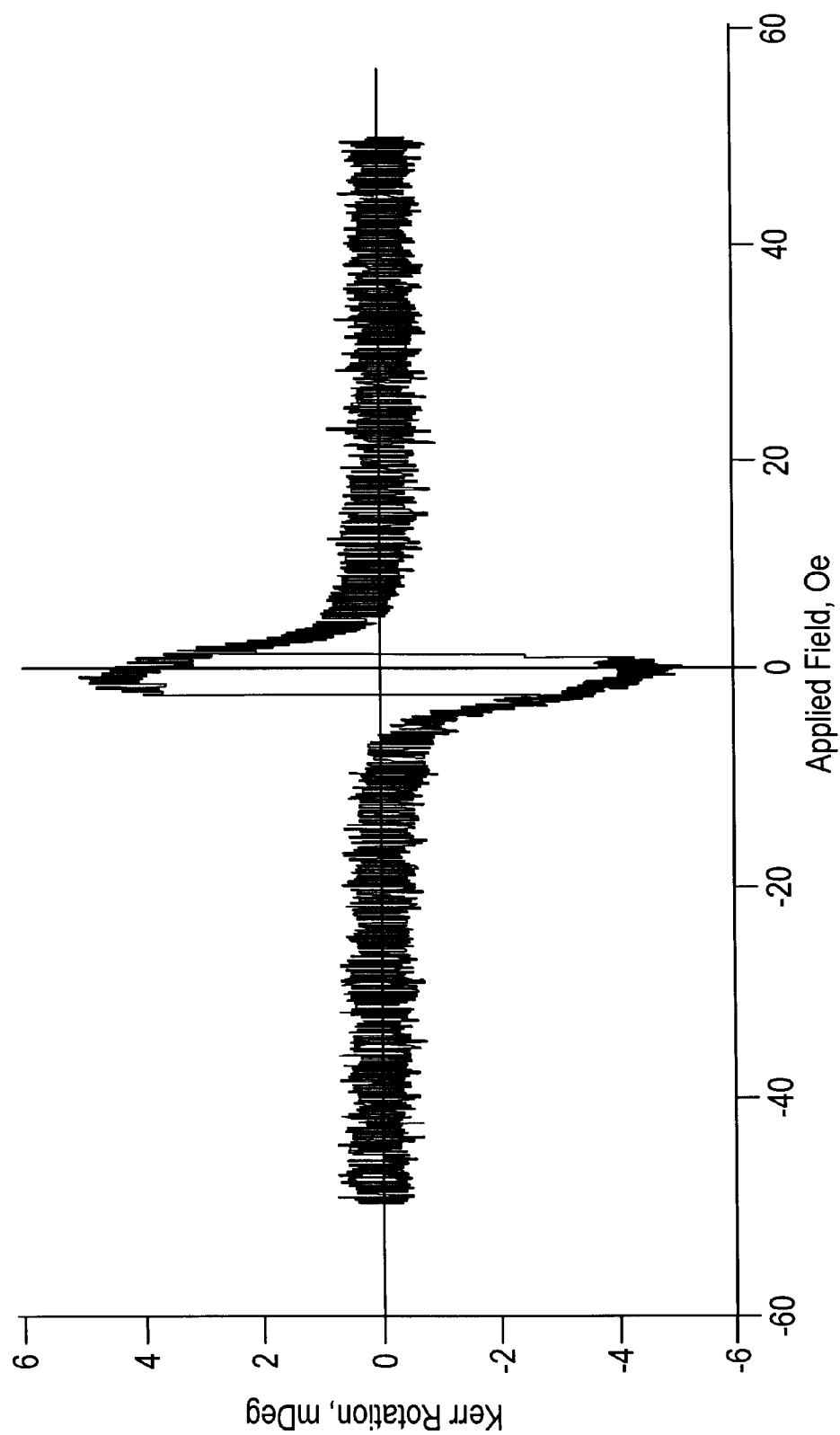
FIG. 8 is a graph of applied magnetic field versus Kerr effect rotation detected along the y axis, wherein the hard axis of the material at the sample point is substantially parallel to the y axis.

FIG. 7 illustrates the response curve for longitudinal or x axis measurements, where the hard axis of the material is substantially aligned with the x axis. Note that as the applied field is increased in either direction from zero, the relative polarization rotation gradually increases until a peak rotation is achieved. FIG. 8 is a plot of transverse or y axis measurements, where the hard axis is substantially aligned with the y axis. The resulting output is characteristic of a transverse, hard axis measurement.

Figure 9:
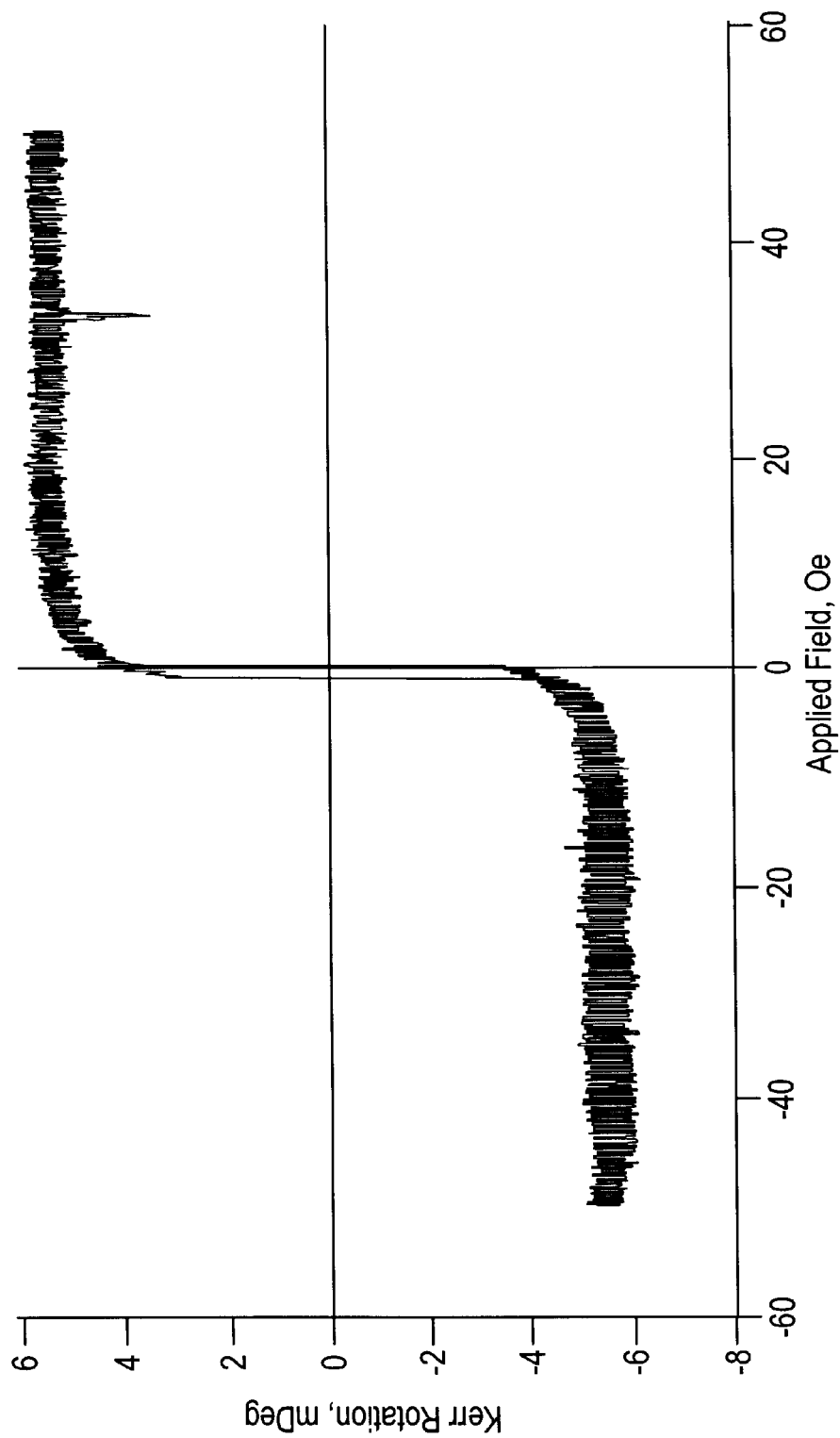
FIG. 9 is a graph of applied magnetic field versus Kerr effect rotation detected along the x axis, wherein the easy and hard axes are offset from the x axis by approximately 45 degrees.
Figure 10:
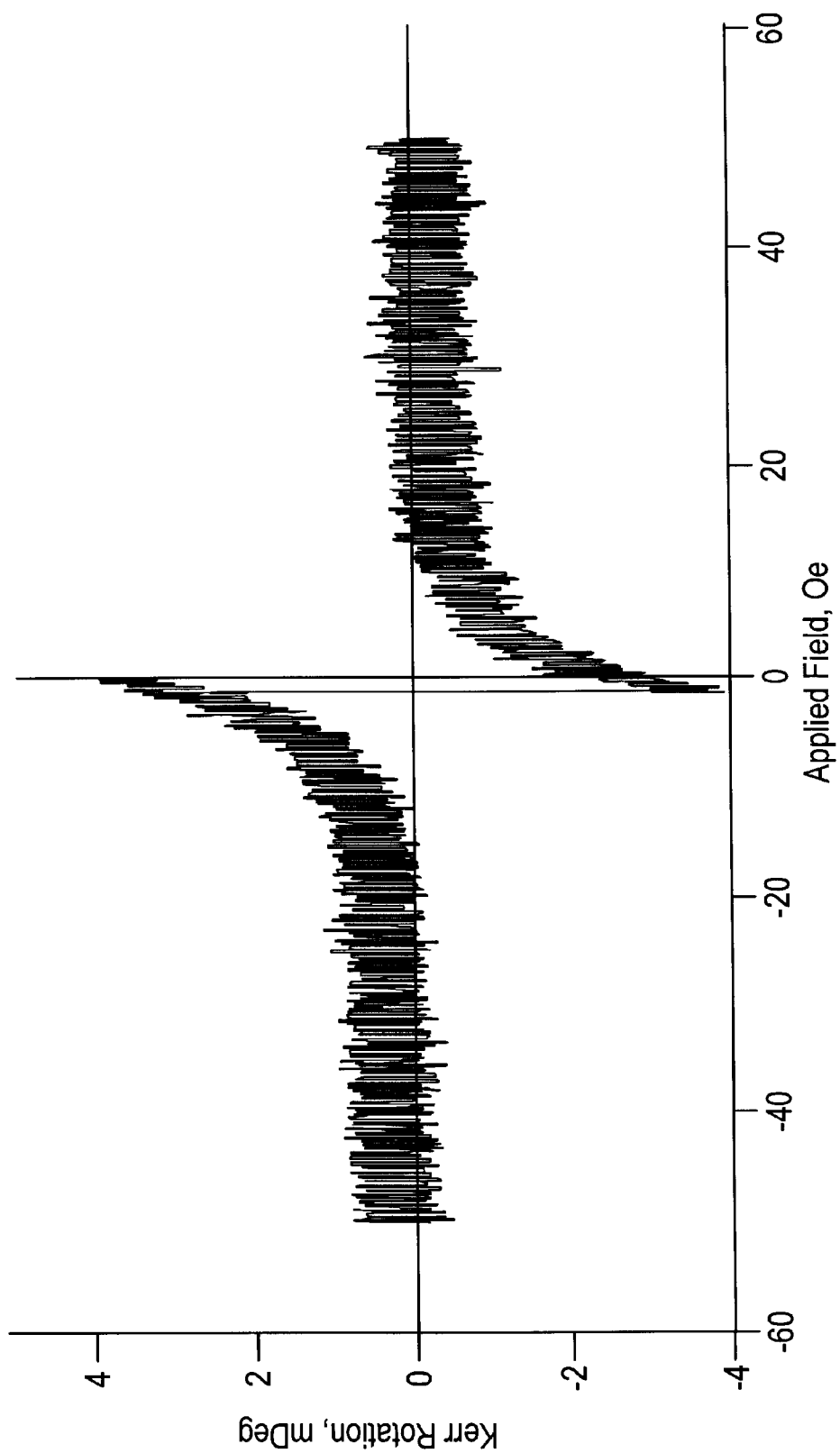
FIG. 10 is a graph of applied magnetic field versus Kerr effect rotation detected along the y axis, wherein the easy and hard axes are offset from the y axis by approximately 45 degrees.

Finally, FIG. 9 illustrates an x axis measurement with the easy and hard axes offset by approximately 45 degrees from the x axis. FIG. 10 shows a transverse measurement, also with the easy and hard axes offset from the measurement axis by approximately 45 degrees.

These graphs illustrate that the magnetization response for a typical anisotropic material varies significantly depending upon the alignment of the easy and hard axes with respect to the measurement system. Thus, in order to fully characterize a sample, it is necessary to have both longitudinal and transverse measurements. Both such measurements enable the creation of a characteristic vector response, as compared to the prior art scalar response.

Figure 3:
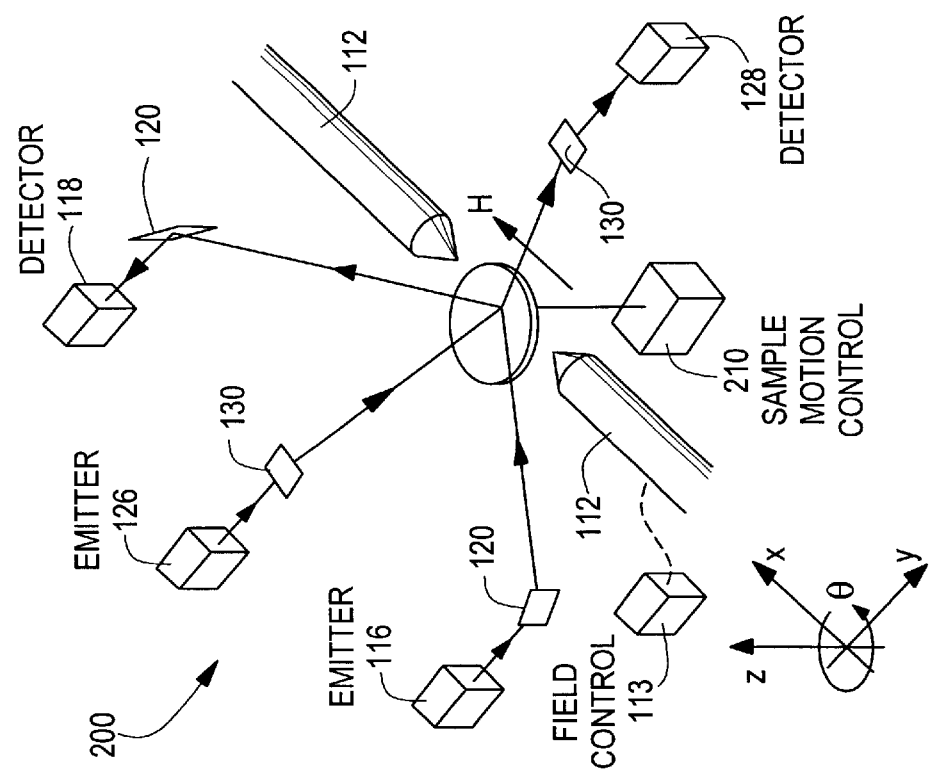
FIG. 3 is a perspective view of the vector magneto-optic Kerr effect sensor of FIG. 2 for use in conjunction with a repositionable sample platform.

A further embodiment 200 of the present invention builds upon the system disclosed with respect to FIG. 2, and is shown in FIG. 3. Here, the platform or stage upon which the material under test 114 is located is capable of precise linear and rotational movement, or in other words precise movement in the x, y, and theta directions. Such a platform may be a multi-axis translation stage as manufactured by Newport Corporation, Irvine, Calif. One or more stepper motors (not shown) under control of a programmed computer or other processing element 210 may be utilized to achieve this movement. Depending upon the embodiment, the control 210 for the platform motors is in communication with the emitters 116, 126, detectors 118, 128 and applied field control 113 in order to minimize the dwell time at each point on the sample under test. With highly accurate translation of the sample under test, it is conceivable that characterizing measurements may be made while the sample under test is being translated, thus further speeding the sample characterization process.

In a first embodiment of the system having movement in x, y, and theta, the motive means are realized as high precision, computer controllable motors that move the sample in the x, y, and theta directions. By appropriately aligning the center of rotation with the test point on the sample, the computer or motion control firmware associated with the processing element 210 computes the x and y motions that are necessary to bring any measurement point back to its original location after it has been rotated by theta degrees. Thus, a full 360 degree rotation of any point can be achieved and the corresponding longitudinal and transverse Kerr signals can be analyzed.

Alternatively, a vector magnet system can be employed in which the sample is translated in the x and y directions and the applied magnetic field is rotated in theta; systems are known which provide a steerable applied field without requiring mechanical movement of the pole pieces or the sample itself. A processing element similar to the processing element 210 is adapted for precisely controlling the linear translations of the sample under test and the rotation of the applied field.

Figure 4:
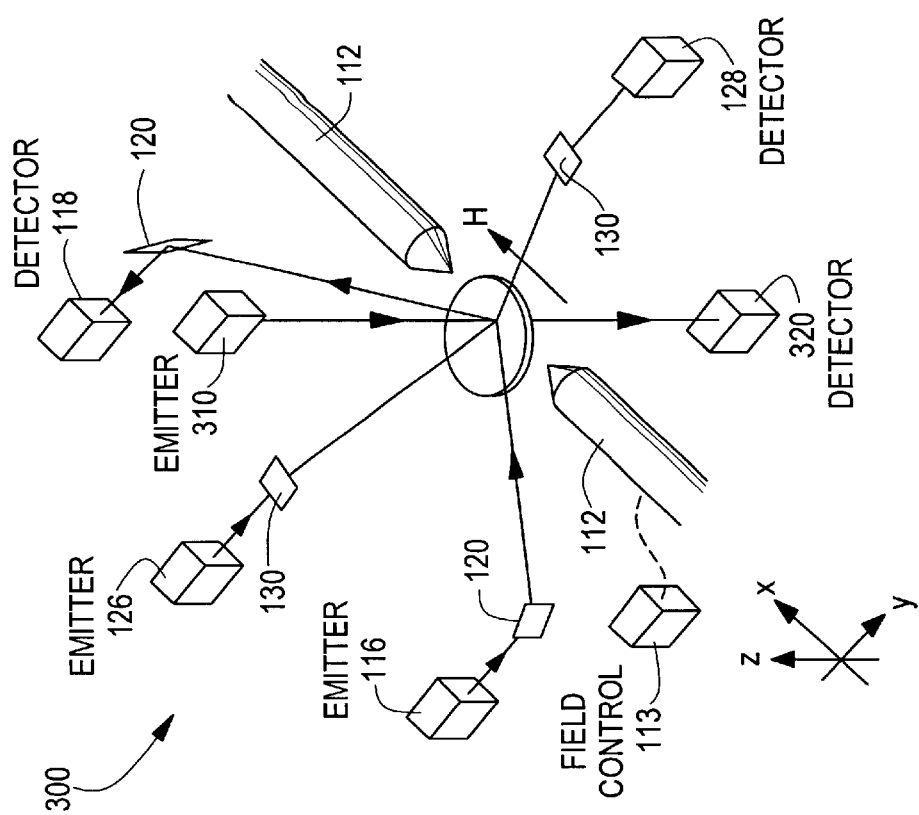
FIG. 4 is a perspective view of the vector magneto-optic Kerr effect sensor of FIG. 2 for use in conjunction with an integrated Faraday effect sensor.

A further embodiment 300 of the presently disclosed invention is illustrated in FIG. 4 which, in addition to the elements of the vector Kerr effect sensor system 100 of FIG. 2, includes a polar Faraday effect sensor system comprised of a radiation emitter 310 and detector 320 pair. As know to one skilled in the art, a Faraday detector is employed for observing changes in radiation polarization as it passes through a target material. In the present case, the observed changes will be characteristic of the response of the subject material to an applied magnetic field H. The provision of an integrated Faraday effect sensing system further enables the rapid and accurate characterization of a light-transmissive material. Control over the Faraday system may be provided independently, or may be integrated with that provided for the Kerr effect sensor systems. Such control may be provided through a direct connection or via data network. The resulting data also may be processed independently, or may be integrated into graphical or text results data for subsequent review by an operator or other data processing system.

In either the embodiment in which the sample is translated and rotated or the embodiment in which the sample is linearly translated and the applied field is rotated, a user interface (not shown) such as a keyboard, mouse and display is provided for enabling a user to define the parameters of operation. The interface may also be used for reviewing the operation of the system and the results of various tests based upon output from the detectors 118, 128. Such a user interface may be provided in conjunction with a system controller such as a programmed computer or networked or intercommunicating programmed computers for carrying out predefined testing regimens on a series of samples. The use of such a system controller is preferred in order to enable the rapid and automated characterization of successive samples. A sample handling robot (not shown) as known in the art may be provided in communication with the system controller to facilitate this automated operation.

These and other examples of the concept of the invention illustrated and described above are intended by way of example and the actual scope of the invention is to be determined by the following claims.

What is claimed is:

1. A vector Kerr effect magnetometer, comprising:
    a magnetic field-imparting module for establishing a magnetic field parallel to a sample surface at a test point on said sample surface;
    a first optical emitter for causing first polarized light to impinge upon said sample surface at said test point and co-planar with said magnetic field;
    a first optical detector for detecting said first polarized light as reflected from said sample surface at said test point and co-planar with said magnetic field;
    a second optical emitter for causing second polarized light to impinge upon said sample surface at said test point and orthogonal to said magnetic field;
    a second optical detector for detecting said second polarized light as reflected from said sample surface at said test point and orthogonal to said magnetic field; and
    a processing element in communication with said first and second optical detectors for characterizing a change in polarization in said detected first and second polarized light.

2. The system of claim 1, further comprising a sample stage, said sample stage for translating a sample in x, y, and theta, where x is parallel to the magnetic field, y is orthogonal to x, and theta is co-planar with x and y.

3. The system of claim 2, wherein said sample stage further comprises a controller for controlling the translation of said sample in x, y, and theta.

4. The system of claim 1, further comprising a field controller for controlling said magnetic field.

5. The system of claim 4, wherein said controller is further for adjusting the angle of said magnetic field in theta about said test point.

6. The system of claim 1, wherein said first and second optical emitters comprise a single optical source.

7. The system of claim 1, wherein said first and second optical detectors comprise a single optical receiver.

8. The system of claim 7, wherein said single optical receiver receives said first and second polarized light simultaneously.

9. The system of claim 7, wherein said single optical receiver receives said first and second polarized light on a time-division multiplexed basis.

10. The system of claim 1, wherein said first and second optical systems further comprise optical reflectors for redirecting said first and second polarized light.

11. A method of characterizing the response in a sample substrate to an applied magnetic field, comprising:

locating said sample substrate proximate a magnetic field-imparting subsystem;

applying a magnetic field substantially parallel to said sample substrate at a test point thereon by operation of said magnetic field-imparting subsystem;

illuminating said test point with a first polarized light beam, said first polarized light beam being substantially co-planar with said applied magnetic field;

illuminating said test point with a second polarized light beam, said second polarized light beam being in a plane substantially orthogonal to said applied magnetic field; and detecting a shift in polarization in said first and second polarized light beams, if any.

12. The method of claim 11, wherein said steps of illuminating said test point comprise activating a respective laser emitter for creating said first and second polarized light beams.

13. The method of claim 11, wherein said steps of illuminating said test point comprise activating a single laser emitter and optically splitting the resulting laser beam for creating said first and second polarized light beams.

14. The method of claim 11, wherein said step of detecting comprises detecting each of said first and second polarized light beams with a respective optical detector and measuring a shift in polarization.

15. The method of claim 11, wherein said step of detecting comprises detecting each of said first and second polarized light beams with a single, multiplexed optical detector and measuring a respective shift in polarization.

16. The method of claim 11, wherein said step of locating comprises disposing said sample substrate on a stage capable of translation in x, y, and theta, wherein x is parallel to said applied magnetic field, y is orthogonal to said applied magnetic field, and theta is co-planar with x and y.

17. The method of claim 11, wherein said step of locating comprises disposing said sample substrate on a stage capable of translation in x and y, said step of applying comprises selectively rotating said applied magnetic field in theta about said test point on said sample substrate, x being parallel to said applied magnetic field, y being orthogonal to said applied magnetic field, and theta being co-planar with x and y.

18. The method of claim 11, further comprising the step of translating said sample substrate in x and/or y by a predetermined linear interval following each iteration of said illuminating steps.

19. The method of claim 11, further comprising the step of rotating said sample substrate by a predetermined amount in theta about said test point prior to repeating said illuminating and detecting steps.

* * * * *